United States Patent [19]

Isono et al.

[11] 4,375,918

[45] Mar. 8, 1983

[54] COLOR CORRECTION APPARATUS FOR A DUPLICATE CAMERA

[75] Inventors: Koichi Isono, Hikone; Tsuneo Takagi, Kurita, both of Japan

[73] Assignee: Dainippon Screen Seizo Kabushiki Kaisha, Japan

[21] Appl. No.: 298,342

[22] Filed: Aug. 31, 1981

[30] Foreign Application Priority Data

Sep. 29, 1980 [JP] Japan .............................. 55-135486

[51] Int. Cl.³ .............................................. G03B 27/73
[52] U.S. Cl. ....................................... 355/35; 355/71
[58] Field of Search .............................. 355/35, 38, 71

[56] References Cited

U.S. PATENT DOCUMENTS 4,101,217 7/1978 Fergg et al. ........................... 355/38
4,120,581 10/1978 Takahashi et al. ..................... 355/38
4,279,502 7/1981 Thurm et al. .......................... 355/38

Primary Examiner—Michael L. Gellner
Attorney, Agent, or Firm—Ostrolenk, Faber, Gerb & Soffen

[57] ABSTRACT

A color correction apparatus for a duplicate camera wherein three color correction filters of three primary colors are provided and are selectively interposed into the exposure light path, is disclosed. An arithmetic unit is connected to a color correction value setup means which sets up color correction values of colors to be removed from an original picture, and it receives these density values as negative values and subtracts the minimum value thereof from each of the other density values to outputs a color correction signal. Then, a control unit connected to the arithmetic unit controls the color correction filters so that they may be interposed into the exposure light path according to the color correction signal.

4 Claims, 4 Drawing Figures

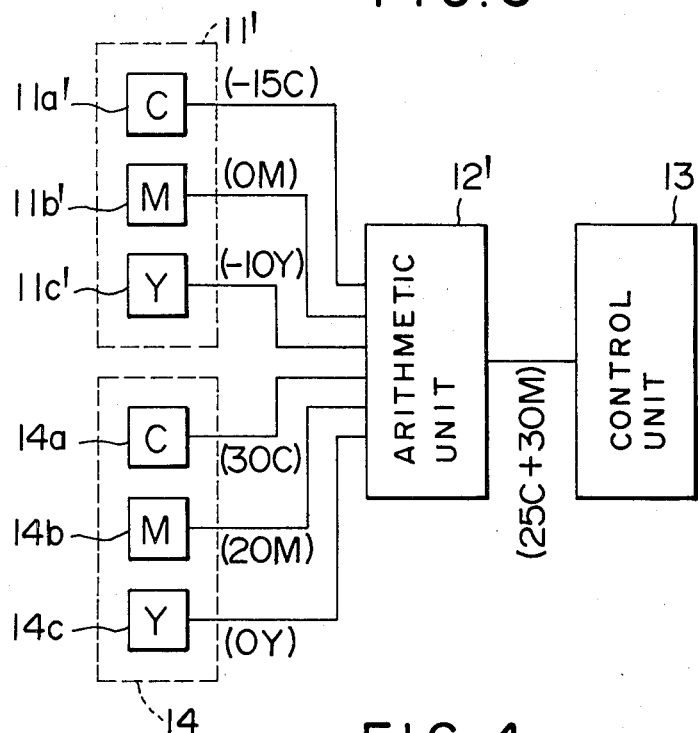
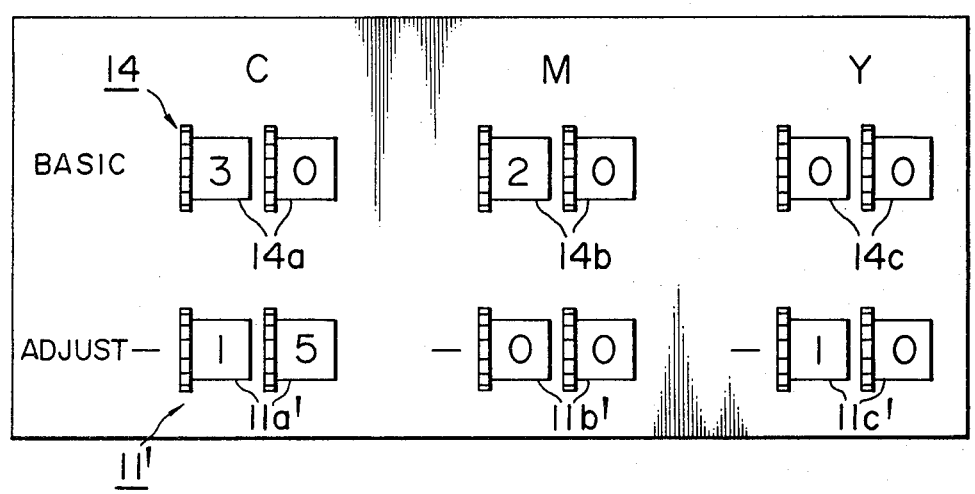

COLOR CORRECTION APPARATUS FOR A DUPLICATE CAMERA

BACKGROUND OF THE INVENTION

This invention relates to a color correction apparatus for a duplicate camera.

In a conventional color correction apparatus for a duplicate camera, color correction filters of three primary colors such as cyan C, magenta M and yellow Y are provided, and an exposure of a photosensitive material is carried out by a so-called multiple exposure method, i.e. the photosensitive material is exposed multiple times by a white light generated by a light source without using the color correction filters and then with the use of one or two of the color correction filters which are interposed selectively and independently between the photosensitive material and the light source on a light axis of the exposure light, as disclosed in Japanese Patent Laying-Open Specification No. 55-146443 (Japanese Patent Application No. 54-53506).

In this case, a variety of colors and density values usually ranging over from 0 to 50 and varying stepwise every five number, of color correction filters are set up, and the color correction filters are adapted to be interposed selectively in the exposure light path. Hence, when the color correction is conducted, first the tendency of the color of an original picture is detected by using a color viewer. Then, the color and the density value which are to be eliminated from the original picture, are determined, and thereafter they are converted into that of its complementary color, viz., the color and the density value of the color correction filter to be interposed in the exposure light path, the converted values being set up.

In the conventional apparatus, for example, after looking at the original picture through a color viewer, if the density value 20 of the cyan C is to be removed from the original picture, it is converted into that of its complementary color composed of the magenta M and the yellow Y, i.e. the density values 20 and 20 of the magenta M and the yellow Y, respectively, which are to be set up. This complicated operation is rather troublesome and is apt to cause a mistake.

SUMMARY OF THE INVENTION

It is an object of the present invention to provide a color correction apparatus for a duplicate camera, free from the aforementioned inconveniences, which is capable of performing a simple, quick and stable operation.

According to the present invention there is provided a color correction apparatus for a duplicate camera wherein three color correction filters of three primary colors are provided and are selectively interposed into the exposure light path, comprising (a) color correction value setup means which sets up color correction values of colors to be removed from the tone of an original picture, (b) an arithmetic unit which is connected to the color correction value setup means and which inputs the density values set up in the color correction value setup means as negative values and subtracts the minimum value of the density values input from each of the other density values to output a color correction signal corresponding to the differences subtracted of the density values, and (c) a control unit which is connected to the arithmetic unit and which controls the color correction filters so that they may be interposed into the exposure light path according to the color correction signal.

BRIEF DESCRIPTION OF DRAWINGS

In order that the present invention may be better understood preferred embodiments thereof will be described with reference to the accompanying drawings, in which:

FIG. 3 is a block diagram of an essential part of another embodiment of a color correction apparatus according to the present invention; and FIG. 4 is an elevational view of an optional color correction value setup means and a basic color correction value setup means used in the apparatus of FIG. 3.

DESCRIPTION OF PREFERRED EMBODIMENTS

Figure 1:
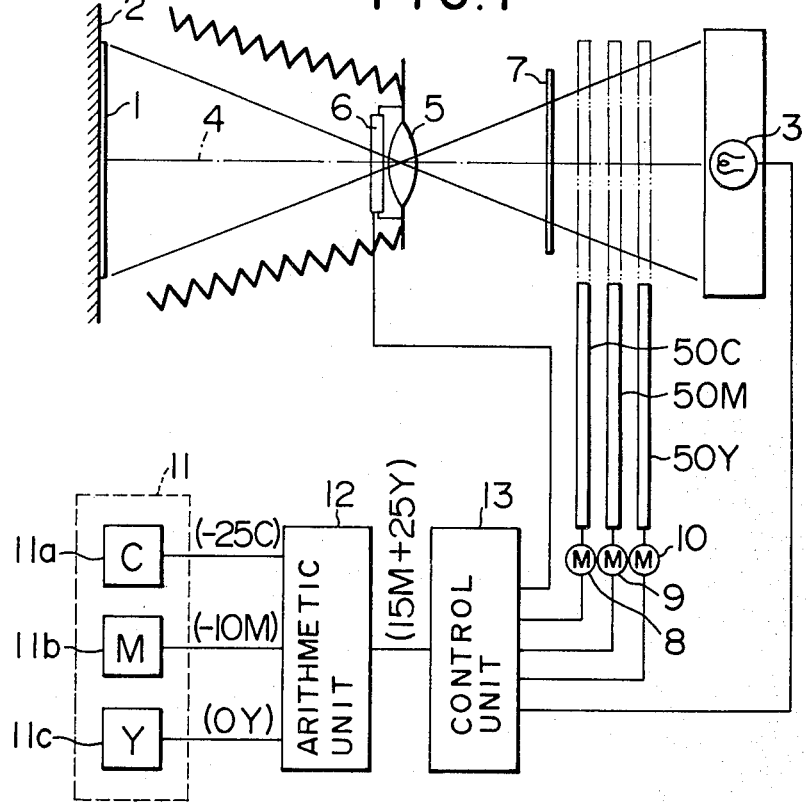
FIG. 1 is a schematic view of one embodiment of a color correction apparatus to the present invention.

Referring now to the drawings there is shown in FIG. 1. one embodiment of a color correction apparatus for a duplicate camera according to the present invention.

A photosensitive material 1 such as a color duplicate film mounted to a film holder 2 and a light source 3 emitting a white light are arranged on a light axis 4 at a certain distance away from each other. Between the photosensitive material 1 and the light source 3 a focusing lens 5 and a shutter 6 attached thereto are disposed on the light axis 4. A color original picture 7 is positioned on the light axis 4 between the light source 3 and the lens 5 so that an image of the original picture may be projected on the photosensitive material 1.

Three color correction filters 50C, 50M and 50Y having maximum densities for cyan C, magenta M and yellow Y are arranged between the light source 3 and the original picture 7 in a position perpendicular skew to the light axis 4, and are adapted to be interposed independently on the light axis 4, as shown by two dotted lines, so as to interfere the light path by means of drive motors 8, 9 and 10 which are connected to the respective filters 50C, 50M and 50Y.

Each filter 50C, 50M or 50Y is coupled to the motor 8, 9 or 10 in a conventional manner. For example, a reversible type motor having a screw rotary shaft is used, and a female screw engaged therewith is attached to the filter. Alternatively, a pinion and a rack engaged therewith are attached to the rotary shaft of the reversible motor and the filter, respectively. Further, instead of the motor 8, 9 or 10, a solenoid valve may be used for driving the filter 50C, 50 M or 50Y.

A color correction value setup means 11 comprises three setup units 11a, 11b and 11c for setting up color correction density values of cyan C, magenta M and yellow Y colors, which are to be removed from the original picture 7. A base 10 digital switch can be used for the setup units 11a, 11b and 11c as shown in FIG. 2.

The setup units 11a, 11b and 11c are connected to an arithmetic unit 12 having a relatively simple calculation circuit. The arithmetic unit 12 inputs the color correction density values set up in the color correction setup means 11 as negative values, and subtracts the minimum one of these density values from each of the other density values to output a color correction signal corresponding to the differences of the density values.

Figure 2:
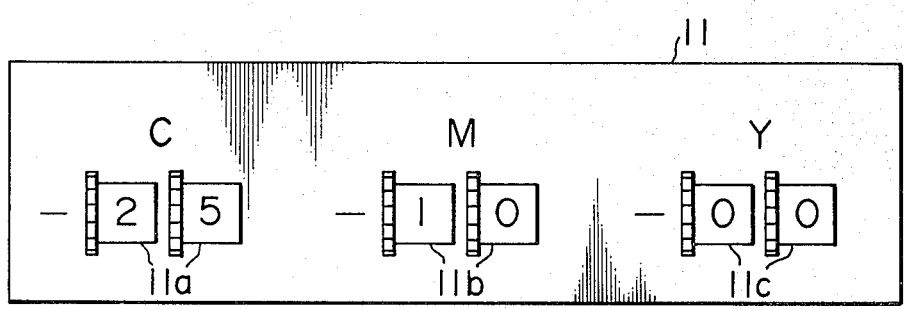
FIG. 2 is an elevational view of a color correction value setup means used in the apparatus of FIG. 1.

For example, as shown in FIG. 2, when the color correction density values of cyan C, magenta M and yellow Y are 25, 10, 0, hereinafter referred to as 25C, 10M, 0Y, are set up in the setup units 11a, 11b and 11c, these values are input to the arithmetic unit 12 as the negative values −25C, −10M and −0Y, and then the minimum value −25 of cyan C is subtracted from the other values −10 and −0 of magenta M and yellow Y to obtain the color correction signal 15M+25Y which is to be fed to a control unit 13.

The control unit 13 so controls the drive motors 8, 9 and 10 that the color correction filters 50C, 50M and 50Y may be interposed on the light axis 4 at the moments corresponding to the density values represented by the color correction signal.

In the example described above, when the control unit 13 receives the color correction signal 15M+25Y, and then it drives the motors 9 and 10 so that the filters 50M and 50Y may be interposed on the light axis 4 at the times corresponding to the density values 15M and 25Y of the correction signal, and controls the opening period of the shutter 6 and the illuminating period of the light source 3, thereby performing an automatic color correction depending on the color correction signal 15M+25Y by the multiple exposure method.

Such a control unit 3 is disclosed in the Japanese Patent Laying-Open Specificaton No. 55-146443. The control unit 13 is provided with a memory (not shown) for storing a proper exposure time $T_0$ on which the photosensitive material is exposed only by the white light, data of the characteristics of the color correction filters for various density values, and the like, and calculates the first partial exposure time $T_1$ on which the photosensitive material 1 is exposed only by the white light, the second partial exposure time $T_2$ on which the photosensitive material 1 is exposed by using the filter 50Y for correcting the yellow of the largest correction amount, which is interposed on the light axis 4 by driving the motor 10, and the third partial exposure time $T_3$ on which the photosensitive material 1 is exposed by using the filters 50M and 50Y, the filter 50M for correcting the magenta of the secondary larger correction amount being further interposed on the light axis 4 by driving the motor 9, depending on the color correction signal 15M+25Y and the given data.

Then, according to these partial exposure times $T_1$, $T_2$ and $T_3$, the light source 3, the shutter 6 and the motors 8, 9 and 10 are controlled to perform the exposure of the photosensitive material, thereby obtaining the same color correction effect as that the photosensitive material is exposed by interposing the color correction filters 15M and 25Y having the density values 15 and 25 in the exposure light path during the entire exposure period according to the color correction signal 15M+25Y.

Therefore, it is readily understood that according to the present invention the color tendency of the original picture is detected by viewing through the color viewer, and then the color correction density values of cyan, magenta and yellow can be directly set up without performing the conversion into the complementary color.

In FIG. 3 there is shown a block diagram of an essential part of another embodiment of a color correction apparatus according to the present invention, having the same construction as the first embodiment of FIG. 1, except that an optional or subjective color correction value setup means 11' having a similar construction to the one 11 of FIG. 1, an arithmetic unit 12' having the similar construction to the one 12 of FIG. 1, and a basic color correction value setup means 14 having the same functions as the color correction value setup means 11 of FIG. 1, are provided.

The optional color correction value setup means 11' comprises three setup units 11a', 11b' and 11c' for setting up color correction density values of cyan C, magenta M and yellow Y depending on subjective or optional factors such as the color tendency of the original picture, and the like.

The basic color correction value setup means 14 comprises three setup units 14a, 14b and 14c for setting up color correction density values of cyan C, magenta M and yellow Y depending on mechanical or semisteady factors such as a nature and characteristics of a photosensitive material, and the like. A base 10 digital switch can be used for the setup units 11a', 11b', 11c', 14a, 14b and 14c.

These setup units 11a', 11b', 11c', 14a, 14b and 14c are connected to the arithmetic units 12'. The arithmetic unit 12' receives the output signals of the setup units and performs the following calculation to output a color correction signal.

That is, in the arithmetic unit 12' each color correction density value of cyan, magenta or yellow, set up in the optional color correction setup means 11' is subtracted from the corresponding color correction density value of cyan, magenta or yellow, set up in the basic color correction setup means 14, and then the minimum value of the obtained density values is subtracted from each of the other density values to output a color correction signal corresponding to the difference of the density values.

For example, as shown in FIG. 4, when the color correction value of cyan C, magenta M and yellow Y of the optional and the basic color correction value means 11a', 11b', 11c', 14a, 14b and 14c are 15C, 0M, 10Y, 30C, 20M and 0Y, the density values 15, 0 and 10 of cyan, magenta and yellow are subtracted from those 30, 20 and 0 of cyan, magenta and yellow to obtain the density values 15, 20 and −10 of cyan, magenta and yellow, respectively, and then the minimum value −10 of yellow is subtracted from the values 15 and 20 of cyan and magenta to obtain a color correction signal 25C+30M which is to be sent to the control unit 13.

Then, the control unit 13 controls the light source 3, the shutter 6 and the motors 8, 9 and 10, thereby performing the color correction, in the same manner as described above.

In the second embodiment, necessary color correction values of a photosensitive material such as a color duplicate film, or the like, can be determined, for example, as 30C+20M, in advance, and the color correction values can conveniently be input directly to the control unit 13.

Although the present invention has been described with reference to the accompanying drawings, however, various changes and modifications can be made by those skilled in the art without departing from the scope of the present invention.

What is claimed is:

1. A color correction apparatus for a duplicate camera wherein three color correction filters of three primary colors are provided and are selectively interposed into the exposure light path, comprising:

(a) color correction value setup means which sets up color correction values of colors to be removed from the tone of an original picture;
(b) an arithmetic unit which is connected to the color correction value setup means and which inputs the density values set up in the color correction value setup means as negative values and subtracts the minimum value of the density values input from each of the other density values to output a color correction signal corresponding to the differences subtracted of the density values; and
(c) a control unit which is connected to the arithmetic unit and which controls the color correction filters so that they may be interposed into the exposure light path according to the color correction signal.

2. An apparatus as defined in claim 1, wherein the color correction value setup means comprising optional color correction value setup means which sets up color correction density values depending on optional factors such as a color tendency of the original picture, and basic color correction value setup means which sets up color correction density values depending on mechanical factors such as a nature and characteristics of the photosensitive material, and wherein the arithmetic unit subtracts each color correction density value of each color which is set up in the optional color correction setup means from the corresponding color correction density value of each color which is set up in the basic color correction setup means and then further subtracts the minimum value of the obtained density values in the subtraction from each of the other density values to output a color correction signal.

3. An apparatus as defined in claim 1 or 2, wherein the color correction value setup means comprising setup units of primary colors.

4. An apparatus as defined in claim 3, wherein a base 10 digital switch is used for the setup unit.

* * * * *